(12) United States Patent
Wilkas

(10) Patent No.: US 11,574,836 B2
(45) Date of Patent: Feb. 7, 2023

(54) HIGH-PRECISION, SHORT TRAVEL TWO DEGREE OF FREEDOM ROBOT ARM

(71) Applicant: Persimmon Technologies Corporation, Wakefield, MA (US)

(72) Inventor: Scott Wilkas, Lexington, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 364 days.

(21) Appl. No.: 16/880,251

(22) Filed: May 21, 2020

(65) Prior Publication Data

US 2020/0373192 A1 Nov. 26, 2020

Related U.S. Application Data

(60) Provisional application No. 62/851,180, filed on May 22, 2019.

(51) Int. Cl.
| | | |
|---|---|---|
| *H01L 21/677* | (2006.01) | |
| *H01L 21/687* | (2006.01) | |
| *B65G 47/92* | (2006.01) | |
| *H02K 7/075* | (2006.01) | |
| *B25J 11/00* | (2006.01) | |
| *B25J 9/04* | (2006.01) | |
| *B25J 9/10* | (2006.01) | |

(52) U.S. Cl.
CPC ........ *H01L 21/68707* (2013.01); *B25J 9/041* (2013.01); *B25J 9/105* (2013.01); *B25J 11/0095* (2013.01); *B65G 47/92* (2013.01); *H01L 21/67742* (2013.01); *H02K 7/075* (2013.01)

(58) Field of Classification Search
CPC ........ B25J 9/041; B25J 9/105; B25J 11/0095; H01L 21/67742
See application file for complete search history.

(56) References Cited

U.S. PATENT DOCUMENTS

| | | | | |
|---|---|---|---|---|
| 4,813,845 | A * | 3/1989 | Swain | B25J 21/005 414/935 |
| 5,374,237 | A * | 12/1994 | McCarty, Jr. | A61H 1/02 601/23 |
| 9,149,936 | B2 | 10/2015 | Hosek et al. | |
| 9,548,231 | B2 | 1/2017 | Hosek et al. | |
| 9,842,757 | B2 | 12/2017 | Hosek et al. | |
| 2008/0304942 | A1 * | 12/2008 | Yazawa | H01L 21/67742 414/217 |

* cited by examiner

*Primary Examiner* — Gerald McClain
(74) *Attorney, Agent, or Firm* — Harrington & Smith

(57) ABSTRACT

An apparatus including a drive having motors and at least two coaxial drive shafts; an arm connected to the drive, where the arm is configured to support at least one substrate thereon; and a transmission connected between the drive and the arm, where the transmission includes an eccentric bearing and a linkage, where the linkage is connected between a first one of the coaxial drive shafts and the arm, where the eccentric bearing is connected to a second one of the coaxial drive shafts, where the arm comprises an aperture, where the eccentric bearing is located in the aperture, and where the eccentric bearing is configured to contact the arm in the aperture.

19 Claims, 6 Drawing Sheets

HIGH-PRECISION, SHORT TRAVEL TWO DEGREE OF FREEDOM ROBOT ARM

CROSS REFERENCE TO RELATED APPLICATION

This application claims priority under 35 USC 119(e) to U.S. provisional application No. 62/851,180 filed May 22, 2019 which is hereby incorporated by reference in its entirety.

BACKGROUND

Technical Field

The example and non-limiting embodiments relate generally to an apparatus for moving substrates and, more particularly, to a robot arm assembly.

Brief Description of Prior Developments

U.S. Pat. No. 9,149,936 discloses a substrate transport apparatus with a drive having motors and an arm which may be extended and retracted by the drive.

SUMMARY

The following summary is merely intended to be exemplary. The summary is not intended to limit the scope of the claims.

In accordance with one aspect, an example is provided with an apparatus comprising a drive comprising motors and at least two coaxial drive shafts; an arm connected to the drive, where the arm is configured to support at least one substrate thereon; and a transmission connected between the drive and the arm, where the transmission comprises an eccentric bearing and a linkage, where the linkage is connected between a first one of the coaxial drive shafts and the arm, and where the eccentric bearing is connected to a second one of the coaxial drive shafts, where the arm comprises an aperture, where the eccentric bearing is located in the aperture, and where the eccentric bearing is configured to contact the arm in the aperture.

In accordance with another aspect, an example is provided with an apparatus comprising: a drive comprising motors and at least two coaxial drive shafts; an arm connected to the drive, where the arm is configured to support at least one substrate thereon, where a second one of the coaxial drive shafts is configured to move the arm; and a linkage connecting a first one of the coaxial drive shafts to the arm, where the linkage comprises a first link connected to the first coaxial drive shaft and a second link connecting the first link to the arm, where the second link comprises:
  a member having a first end rotatably connected to the first link and a second end rotatably connect to the arm; or
  a flexure having a first end connected to the first link and a second end connected to the arm.

In accordance with another aspect, an example is provided comprising: connecting a first coaxial drive shaft of a drive to an arm by a linkage, where the arm has a first end at the drive and an opposite second end, where the opposite second end forms an end effector configured to support at least one substrate thereon; connecting a second coaxial drive shaft of the drive to an eccentric bearing; and locating the eccentric bearing in an aperture of the arm, where the aperture is located in the first end, where the eccentric bearing contacts a side wall of the aperture of the arm in the aperture.

BRIEF DESCRIPTION OF THE DRAWINGS

The foregoing aspects and other features are explained in the following description, taken in connection with the accompanying drawings, wherein.

DETAILED DESCRIPTION OF EMBODIMENTS

Figure 1:
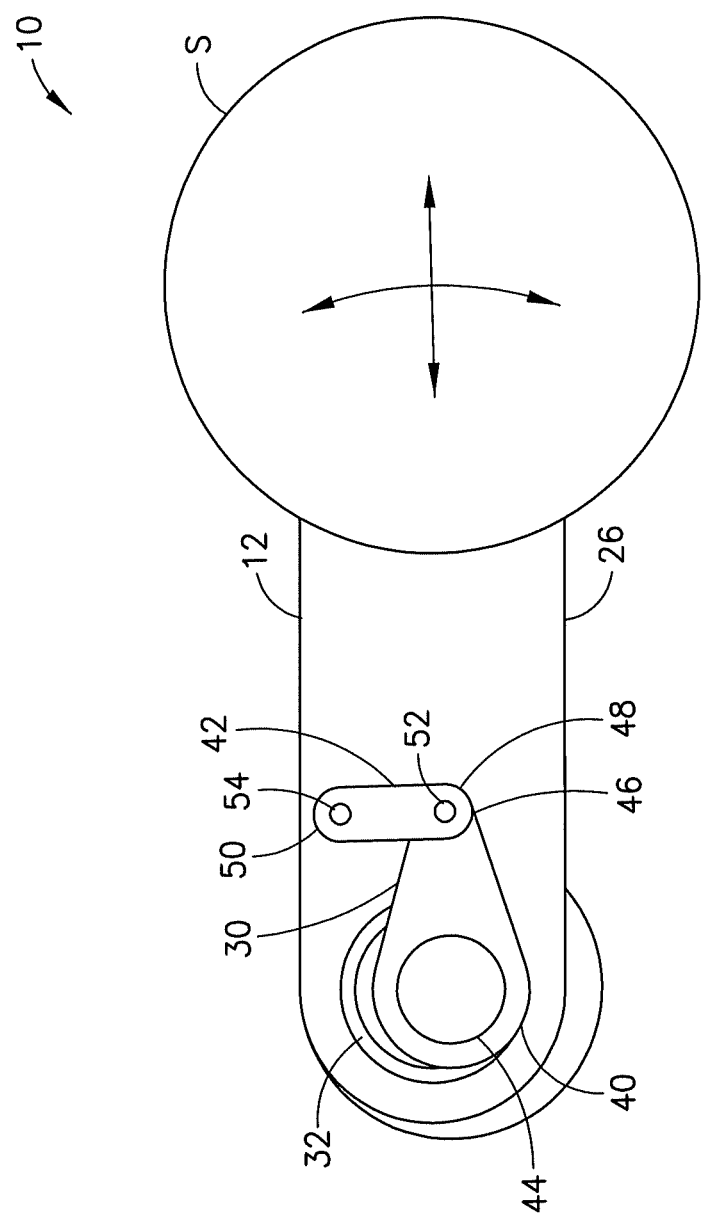
FIG. 1 is a top plan view of an example embodiment comprising features as described herein.

Referring to FIG. 1, there is shown a top plan view of a substrate transport apparatus 10 incorporating features of an example embodiment. Although the features will be described with reference to the example embodiments shown in the drawings, it should be understood that features can be embodied in many alternate forms of embodiments. In addition, any suitable size, shape or type of elements or materials could be used.

Figure 2:
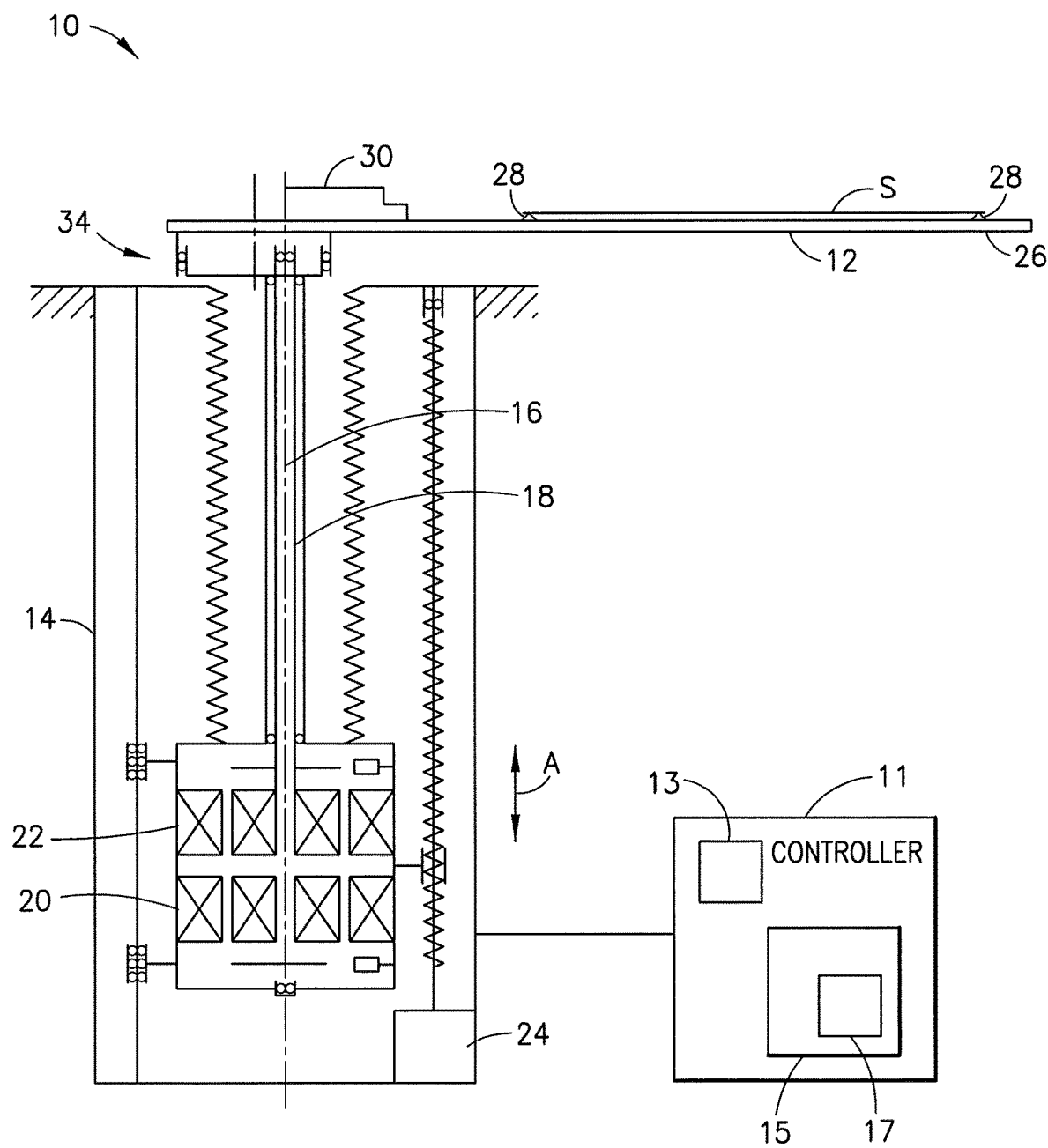
FIG. 2 is a diagram illustrating some of the features of the embodiment shown in FIG. 1.

Referring also to FIG. 2, the substrate transport apparatus 10 comprises an arm 12 and a drive 14. The substrate transport apparatus 10 is configured to move a substrate S which is supported by the arm 12. Examples of a drive are described in U.S. Pat. Nos. 9,149,936; 9,548,231; and 9,842,757 which are hereby incorporated by reference in their entireties.

Modern semiconductor process technology is constantly striving to fit more devices in smaller packages. Processing smaller devices requires greater positional repeatability and accuracy from wafer/substrate handling equipment. Traditional wafer handling robots use multiple link SCARA arms. This style arm uses belts, bands, and/or bearings to actuate and control position of each link. Since these links are assembled in series a small position error at each joint can compound to create a large position error at the last link in the assembly where the work is being performed. Features as described herein provide a single link two degree of freedom robot arm to provide greater position precision in applications which only require a small radial stroke/travel. This arm can be used on a traditional concentric driveshaft semiconductor robot.

Greater precision is achieved by:
  Reduction in the number of arm links, moving joints, and power couplings/transmissions
  Increased effective rotation encoder resolution for a short range of linear arm travel In the example shown, the drive 14 comprise coaxial drive shafts 16, 18, motors 20, 22 for rotating the drive shafts, and a vertical drive 24. The vertical drive is configured to move the coaxial drive shafts 16, 18 and the motors 20, 22 up and down as indicated by arrow A. The arm 12 functions as an end effector configured to support the substrate S thereon.

The arm 12 generally comprises a first member 26, substrate supports 28 at a distal end of the first member 26, and a second member 30. A proximal end of the first member 26 has an aperture 32 therethrough. The outer drive shaft 18 is connected to a bearing 34. The bearing 34 is connected to the proximal end of the first member 26. The bearing 34 is an eccentric bearing. Thus, as the outer drive shaft 18 is rotated, the bearing 34 is configured to rotate the proximal end of the first member 26 in an eccentric path.

In the example embodiment shown, the second member 30 comprises two links 40, 42. The first link 40 has a first end 44 connected to the inner drive shaft 16, and an opposite second end 46 connected to the second link 42 at connection 52. The second link 42 has a first end connected to the first link 40 and a second end 50 connected to the first member 26 at connection 54. The connections 52, 54 are rotatable connections. The first end 44 of the first link 40 extends through the aperture 32 to the inner shaft 16. With this configuration the outer robot drive shaft is configured to control arm extension through the eccentric bearing mounted at the shoulder, and the inner drive shaft 16 is configured to control arm rotation position with the links 40, 42. The aperture 32 is oversized relative to the portion of the first end 44 of the first link 40 located in the aperture 32. This oversized aperture 32 provides a clearance between the inner surface of the first member 26 at the aperture 32 relative to the outer surface of the first end 44 of the first link 40 in the aperture 32 to account for the eccentric movement of the proximal end of the first member 26 relative to the center axis of the drive shafts.

In an alternate example, the inner drive shaft may extend through the aperture 32. In such an alternate example embodiment, the aperture 32 may be provided as oversized relative to the outer diameter of the inner shaft 16 to provide a clearance between the inner surface of the first member 26 at the aperture 32 relative to the outer surface of the drive shaft 16 in the aperture 32 to account for the eccentric movement of the proximal end of the first member 26 relative to the center axis of the drive shafts.

The apparatus 10 may comprise, or be connected to, a controller 11. The controller 11 may comprises one or more processors 13 and one or more memory 15. The memory 15 may comprise software or computer code 17 which is configured to control movement of motors in the drive 14 and receive sensor signals from sensors in the drive or the arm. The controller may be used to control movements of the arm, such as for rotation about the center axis of the drive 14 and extension and retraction of the arm relative to the center axis of the drive unit. In alternative embodiments, other types of drive units could also be used. In addition, although only one arm link 26 is shown as a rigid member, the arm may comprise multiple links and an end effector connected in series for example, such as with a scara arm for example.

Figure 3A:
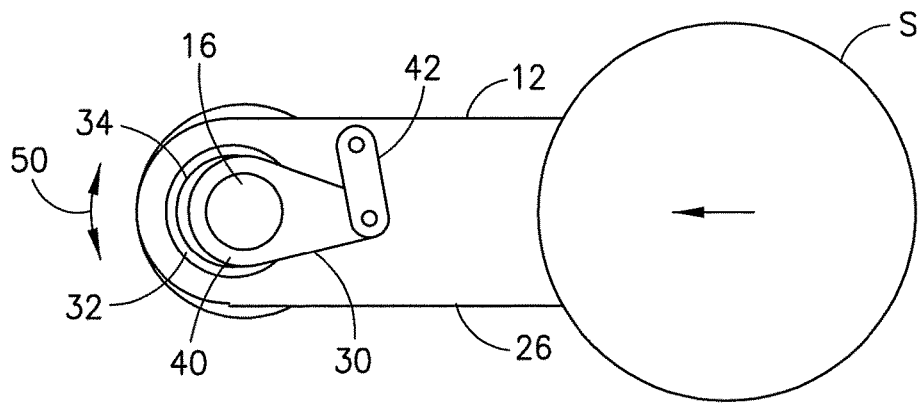
FIGS. 3A-3C are diagrams illustrating extension and retraction movement of the arm shown in FIGS. 1-2.
Figure 3B:
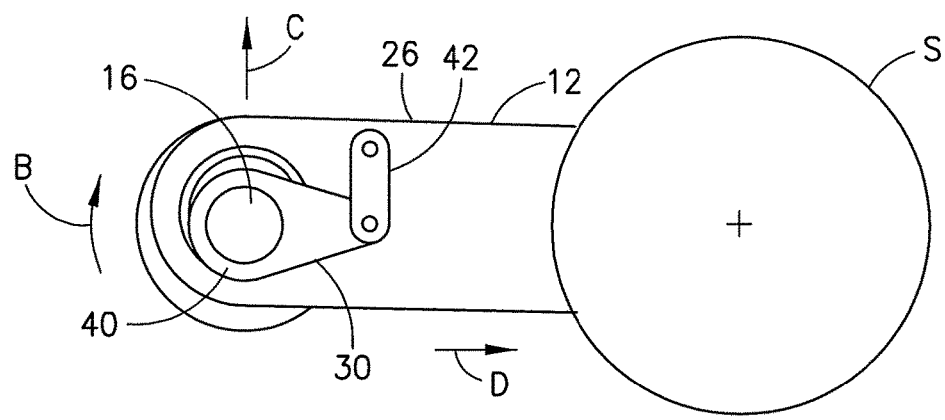
Figure 3C:
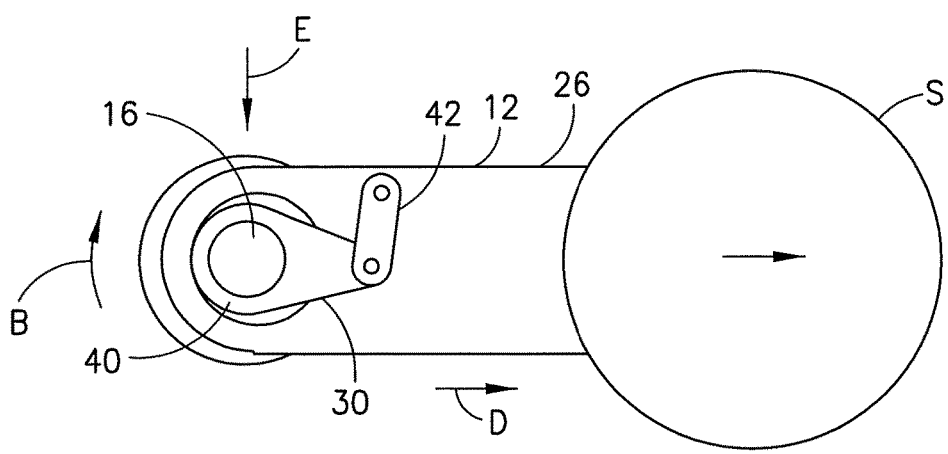

Referring also to FIGS. 3A-3C, an example of movement using the arm 12 and drive 14 will be described. The outer drive shaft 18 is rotatable as indicated by arrow 50 while the inner drive shaft 16 remains stationary. FIG. 3A shows arm in a retracted position. The second member controls the orientation of the first member 26 while allowing for extension and retraction of the first member 26. As illustrated by FIG. 3B, as the outer drive shaft is rotated in direction B the proximal end of the first member 26 is moved in direction C, and the entire first member 26 is also extended in direction D. Continued rotation of the outer drive shaft in direction B subsequently causes the proximal end of the first member 26 to be moved in direction E (opposite to direction C), and the entire first member 26 also continues to extend in direction D until it reaches its final extended position shown in FIG. 3C. The outer drive shaft 18 may rotate 180 degrees to move the arm 12 from the fully retracted position shown in FIG. 3A to the fully extended position shown in FIG. 3C. In order to retract the arm 12 from the fully extended position shown in FIG. 3C to the fully retracted position shown in FIG. 3A, the outer shaft 18 may continue to rotated in direction B 180 degrees or may be rotated 180 degrees in a direction opposite to direction B. The links 40, 42, and their connections to the inner drive shaft 16 and the first member 26, limit the orientation of the first member 26 relative to the axis of the drive shafts as the first member 26 is extended and retracted.

Figure 6A:
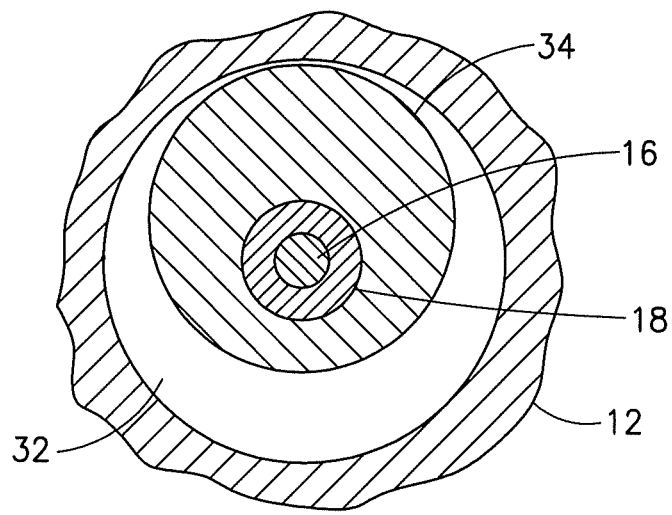
FIG. 6A is a cross sectional diagram illustrating one example of the eccentric bearing shown in FIGS. 1-5C.
Figure 6B:
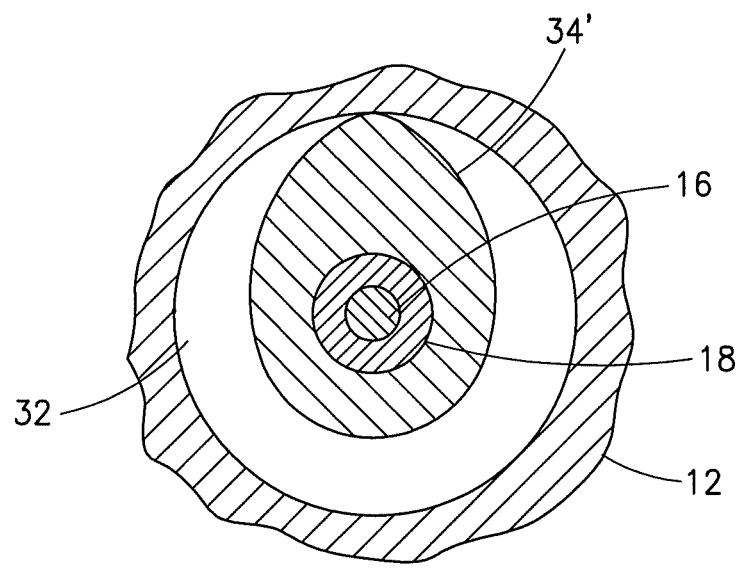
FIG. 6B is a cross sectional diagram illustrating another example of the eccentric bearing shown in FIGS. 1-5C.

FIG. 6A shows a cross sectional view of one example where the aperture 36 is circular, and the bearing is circular but connected to the outer shaft 18 at an off-set from the center axis of the drive shaft. FIG. 6B shows a cross sectional view of another example where the aperture 36 is circular, and the bearing 34' is non-circular. These are merely some examples of an eccentric bearing which may be used to provide translation movement of the arm member 26 caused by rotation of the outer shaft 18.

Figure 4A:
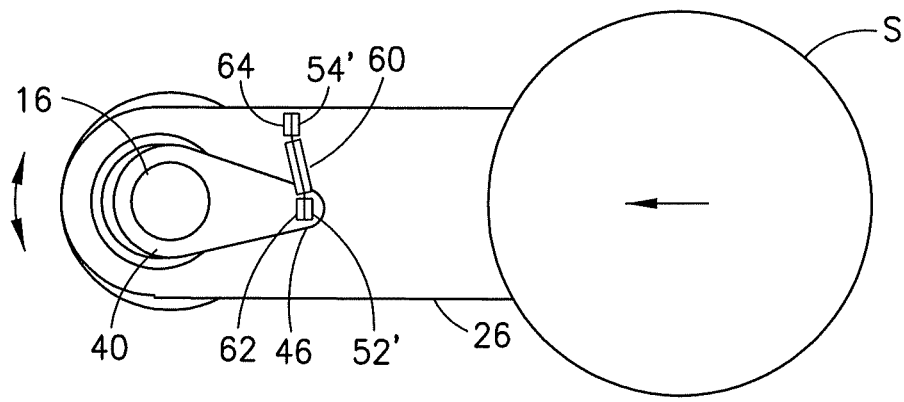
FIGS. 4A-4C are diagrams illustrating extension and retraction movement of an alternate example of the arm shown in FIGS. 1-2.
Figure 4B:
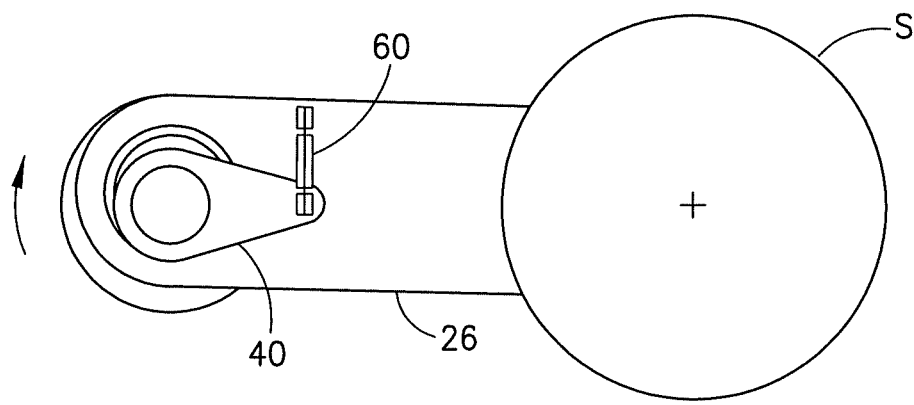
Figure 4C:
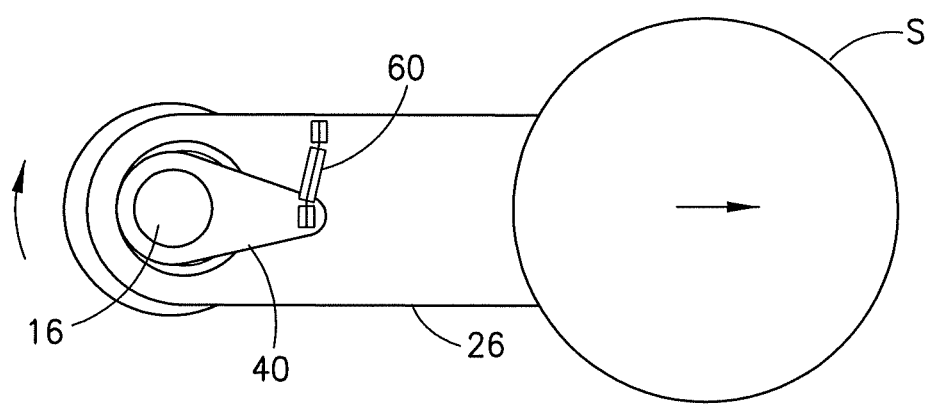

Referring also to FIGS. 4A-4B, an alternate example embodiment is shown. In this example, rather than having the second link 42, the second member comprises a flexure 60. The flexure 60 has a first end 62 connected to the second end 46 of the link 40 and an opposite second end 64 connected to the first member 26. The connections 52' and 54' are fixed and non-rotatable. The flexure 60 helps to control arm orientation while allowing extension and retraction as illustrated by FIGS. 4A-4C.

Figure 5A:
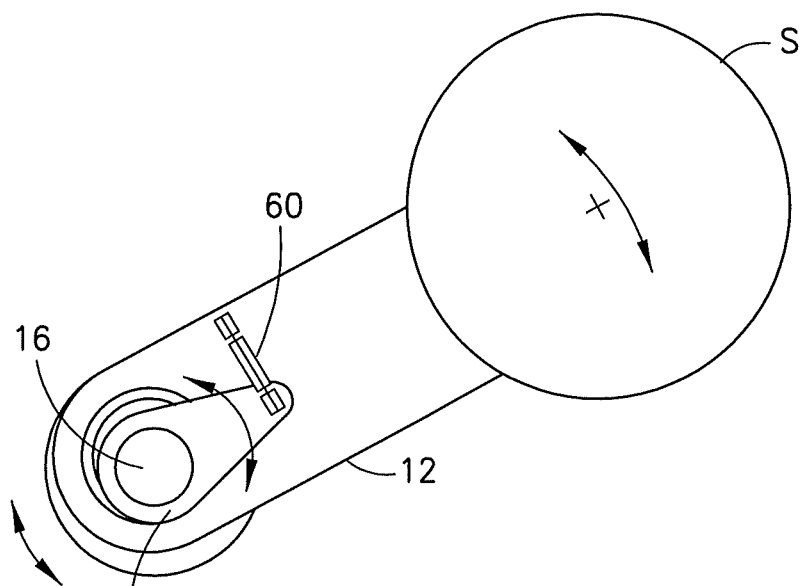
FIGS. 5A-5C are diagrams illustrating rotation of the arm shown in FIGS. 4A-4C about the drive.
Figure 5B:
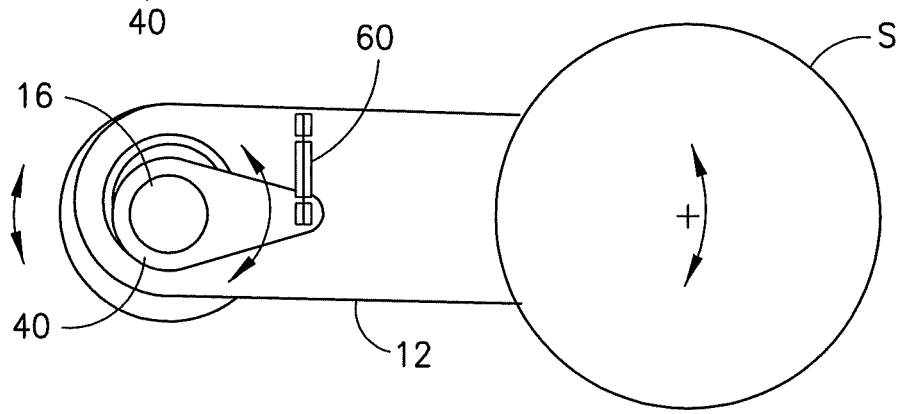
Figure 5C:
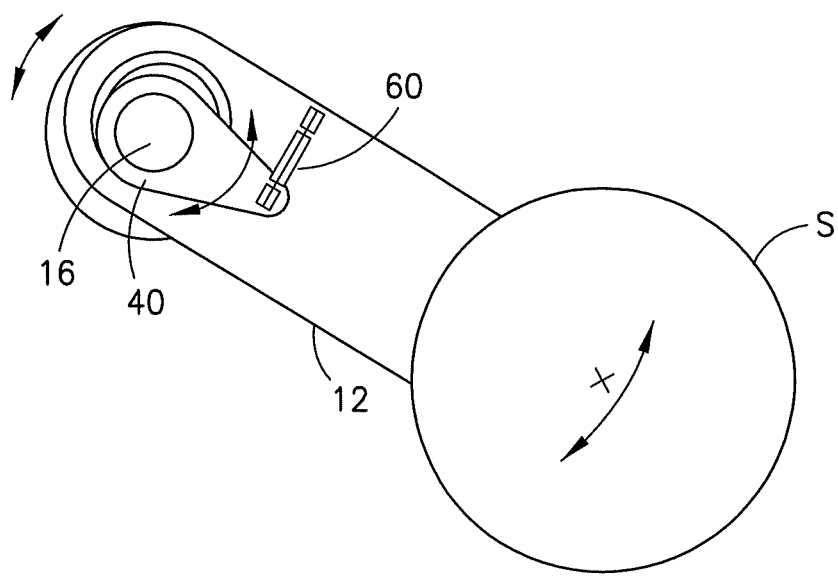

When it is desired to rotate the arm 12 about the drive 14, both the inner shaft 16 and the outer shaft 18 may be rotated as illustrated by FIGS. 5A-5C. The features from the example embodiments shown in the drawings are able to be used for providing a high-precision, short travel, two degree of freedom robot arm. The outer robot drive shaft may be used to control arm extension and retraction through an eccentric bearing mounted at the shoulder of the arm. The inner robot drive shaft may be used to control arm rotation position with the linkage or flexure described above.

An example embodiment may be provided with an apparatus comprising: a drive comprising motors and at least two coaxial drive shafts; an arm connected to the drive, where the arm is configured to support at least one substrate thereon; and a transmission connected between the drive and the arm, where the transmission comprises an eccentric bearing and a linkage, where the linkage is connected between a first one of the coaxial drive shafts and the arm, and where the eccentric bearing is connected to a second one of the coaxial drive shafts, where the arm comprises an aperture, where the eccentric bearing is located in the aperture, and where the eccentric bearing is configured to contact the arm in the aperture.

The aperture may be larger than the bearing, where a first side of the eccentric bearing contacts the arm in the aperture, and where an opposite second side of the eccentric bearing is spaced from the arm in the aperture. The second coaxial drive shaft may be configured to rotate the eccentric bearing in the aperture to move the first side of the eccentric bearing into contact with different areas of the arm inside the aperture. The aperture may have a circular shape. The eccentric bearing may have a circular shape and the second drive shaft may be connected to the eccentric bearing at an off-center location. The eccentric bearing may have a non-circular cross sectional shape. The eccentric bearing may have a shape about its side perimeter which is different than a shape of the side perimeter of the aperture. The linkage may comprise a first link connected to the first coaxial drive shaft and a second link connecting the first link to the arm, where the second link comprises a rigid member having a first end rotatably connected to the first link and an opposite second end rotatably connect to the arm. The linkage may comprise a first link connected to the first coaxial drive shaft and a second link connecting the first link to the arm, where the second link comprises a flexure having a first end stationarily connected to the first link and a second end stationarily connected to the arm. The apparatus may be configured to extend or retract the arm relative to a center axis of the coaxial drive shafts when the second coaxial drive shaft is rotated while the first coaxial drive shaft remains stationary. The apparatus may be configured to not extend or retract the arm relative to a center axis of the coaxial drive shafts when the first and second coaxial drive shafts are rotated together.

An example embodiment may be provided with an apparatus comprising: a drive comprising motors and at least two coaxial drive shafts; an arm connected to the drive, where the arm is configured to support at least one substrate thereon, where a second one of the coaxial drive shafts is configured to move the arm; and a linkage connecting a first one of the coaxial drive shafts to the arm, where the linkage comprises a first link connected to the first coaxial drive shaft and a second link connecting the first link to the arm, where the second link comprises:

a member having a first end rotatably connected to the first link and a second end rotatably connect to the arm; or a flexure having a first end connected to the first link and a second end connected to the arm.

The arm may be connected to the drive by a connection comprising an eccentric bearing connected to the second coaxial drive shaft, where the eccentric bearing is located in an aperture of the arm, where the eccentric bearing contacts the arm in the aperture. The aperture may be larger than the bearing, where a first side of the eccentric bearing contacts the arm in the aperture, and where an opposite second side of the eccentric bearing is spaced from the arm in the aperture. The second coaxial drive shaft may be configured to rotate the eccentric bearing in the aperture to move the first side of the eccentric bearing into contact with different areas of the arm inside the aperture. The aperture may have a circular shape. The eccentric bearing may have a circular shape and the second drive shaft is connected to the eccentric bearing at an off-center location. The eccentric bearing may have a non-circular cross sectional shape. The eccentric bearing may have a shape about its side perimeter which is different than a shape of the side perimeter of the aperture.

An example method may be provided comprising: connecting a first coaxial drive shaft of a drive to an arm by a linkage, where the arm has a first end at the drive and an opposite second end, where the opposite second end forms an end effector configured to support at least one substrate thereon; connecting a second coaxial drive shaft of the drive to an eccentric bearing; and locating the eccentric bearing in an aperture of the arm, where the aperture is located in the first end, where the eccentric bearing contacts a side wall of the aperture of the arm in the aperture.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus comprising:
   a drive comprising motors and at least two coaxial drive shafts;
   an arm connected to the drive, where the arm is configured to support at least one substrate thereon; and
   a transmission connected between the drive and the arm, where the transmission comprises an eccentric bearing and a linkage, where the linkage is connected between a first one of the coaxial drive shafts and the arm, and where the eccentric bearing is connected to a second one of the coaxial drive shafts,
   where the arm comprises an aperture, where the eccentric bearing is located in the aperture, and where the eccentric bearing is configured to contact the arm in the aperture.

2. An apparatus as in claim 1 where the aperture is larger than the bearing, where a first side of the eccentric bearing contacts the arm in the aperture, and where an opposite second side of the eccentric bearing is spaced from the arm in the aperture.

3. An apparatus as in claim 2 where the second coaxial drive shaft is configured to rotate the eccentric bearing in the aperture to move the first side of the eccentric bearing into contact with different areas of the arm inside the aperture.

4. An apparatus as in claim 1 where the aperture has a circular shape.

5. An apparatus as in claim 4 where the eccentric bearing has a circular shape and the second drive shaft is connected to the eccentric bearing at an off-center location.

6. An apparatus as in claim 4 where the eccentric bearing has a non-circular cross sectional shape.

7. An apparatus as in claim 1 where the eccentric bearing has a shape about its side perimeter which is different than a shape of the side perimeter of the aperture.

8. An apparatus as in claim 1 where the linkage comprises a first link connected to the first coaxial drive shaft and a second link connecting the first link to the arm, where the second link comprises a rigid member having a first end rotatably connected to the first link and an opposite second end rotatably connect to the arm.

9. An apparatus as in claim 1 where the linkage comprises a first link connected to the first coaxial drive shaft and a second link connecting the first link to the arm, where the second link comprises a flexure having a first end stationarily connected to the first link and a second end stationarily connected to the arm.

10. An apparatus as in claim 1 where the apparatus is configured to extend or retract the arm relative to a center axis of the coaxial drive shafts when the second coaxial drive shaft is rotated while the first coaxial drive shaft remains stationary.

11. An apparatus as in claim 1 where the apparatus is configured to not extend or retract the arm relative to a center axis of the coaxial drive shafts when the first and second coaxial drive shafts are rotated together.

12. An apparatus comprising:
    a drive comprising motors and at least two coaxial drive shafts;

an arm connected to the drive, where the arm is configured to support at least one substrate thereon, where a second one of the coaxial drive shafts is configured to move the arm; and a linkage connecting a first one of the coaxial drive shafts to the arm, where the linkage comprises a first link connected to the first coaxial drive shaft and a second link connecting the first link to the arm, where the second link comprises:

a member having a first end rotatably connected to the first link and a second end rotatably connect to the arm; or a flexure having a first end connected to the first link and a second end connected to the arm;

where the arm is connected to the drive by a connection comprising an eccentric bearing connected to the second coaxial drive shaft, where the eccentric bearing is located in an aperture of the arm, where the eccentric bearing contacts the arm in the aperture.

13. An apparatus as in claim 12 where the aperture is larger than the bearing, where a first side of the eccentric bearing contacts the arm in the aperture, and where an opposite second side of the eccentric bearing is spaced from the arm in the aperture.

14. An apparatus as in claim 12 where the second coaxial drive shaft is configured to rotate the eccentric bearing in the aperture to move the first side of the eccentric bearing into contact with different areas of the arm inside the aperture.

15. An apparatus as in claim 12 where the aperture has a circular shape.

16. An apparatus as in claim 15 where the eccentric bearing has a circular shape and the second drive shaft is connected to the eccentric bearing at an off-center location.

17. An apparatus as in claim 15 where the eccentric bearing has a non-circular cross sectional shape.

18. An apparatus as in claim 12 where the eccentric bearing has a shape about its side perimeter which is different than a shape of the side perimeter of the aperture.

19. A method comprising:

connecting a first coaxial drive shaft of a drive to an arm by a linkage, where the arm has a first end at the drive and an opposite second end, where the opposite second end forms an end effector configured to support at least one substrate thereon;

connecting a second coaxial drive shaft of the drive to an eccentric bearing; and locating the eccentric bearing in an aperture of the arm, where the aperture is located in the first end, where the eccentric bearing contacts a side wall of the aperture of the arm in the aperture.

\* \* \* \* \*